(12) United States Patent
Le et al.

(10) Patent No.: US 7,265,585 B2
(45) Date of Patent: Sep. 4, 2007

(54) METHOD TO IMPROVE CURRENT AND SLEW RATE RATIO OF OFF-CHIP DRIVERS

(75) Inventors: Thoai Thai Le, Cary, NC (US); George Alexander, Durham, NC (US)

(73) Assignee: Infineon Technologies AG, Munich (DE)

( * ) Notice: Subject to any disclaimer, the term of this patent is extended or adjusted under 35 U.S.C. 154(b) by 188 days.

(21) Appl. No.: 11/012,777

(22) Filed: Dec. 14, 2004

(65) Prior Publication Data

US 2006/0125520 A1    Jun. 15, 2006

(51) Int. Cl.
*H03K 19/0175* (2006.01)
(52) U.S. Cl. .............................. 326/83; 326/27; 326/87
(58) Field of Classification Search .................. 326/26, 326/27, 82, 83, 87
See application file for complete search history.

(56) References Cited

U.S. PATENT DOCUMENTS 5,811,991 A * 9/1998 Takashima .................... 326/97
6,163,169 A * 12/2000 Lawson ........................ 326/58

* cited by examiner

*Primary Examiner*—Don Le
(74) *Attorney, Agent, or Firm*—Patterson & Sheridan, L.L.P.

(57) ABSTRACT

An off-chip driver (OCD) circuit and technique to reduce skew between rising and falling edges of output signals as process conditions vary are provided. Variations in process conditions may result in stronger or weaker relative current drive between NMOS and PMOS transistors. One or more process-dependent compensating current paths may be added to conventional pull-up and/or pull-down current paths to compensate for process variations by supplementing the current drive of transistors used to charge (PMOS) or discharge (NMOS) an output node of and end driver (e.g., inverter) stage of an OCD.

23 Claims, 7 Drawing Sheets

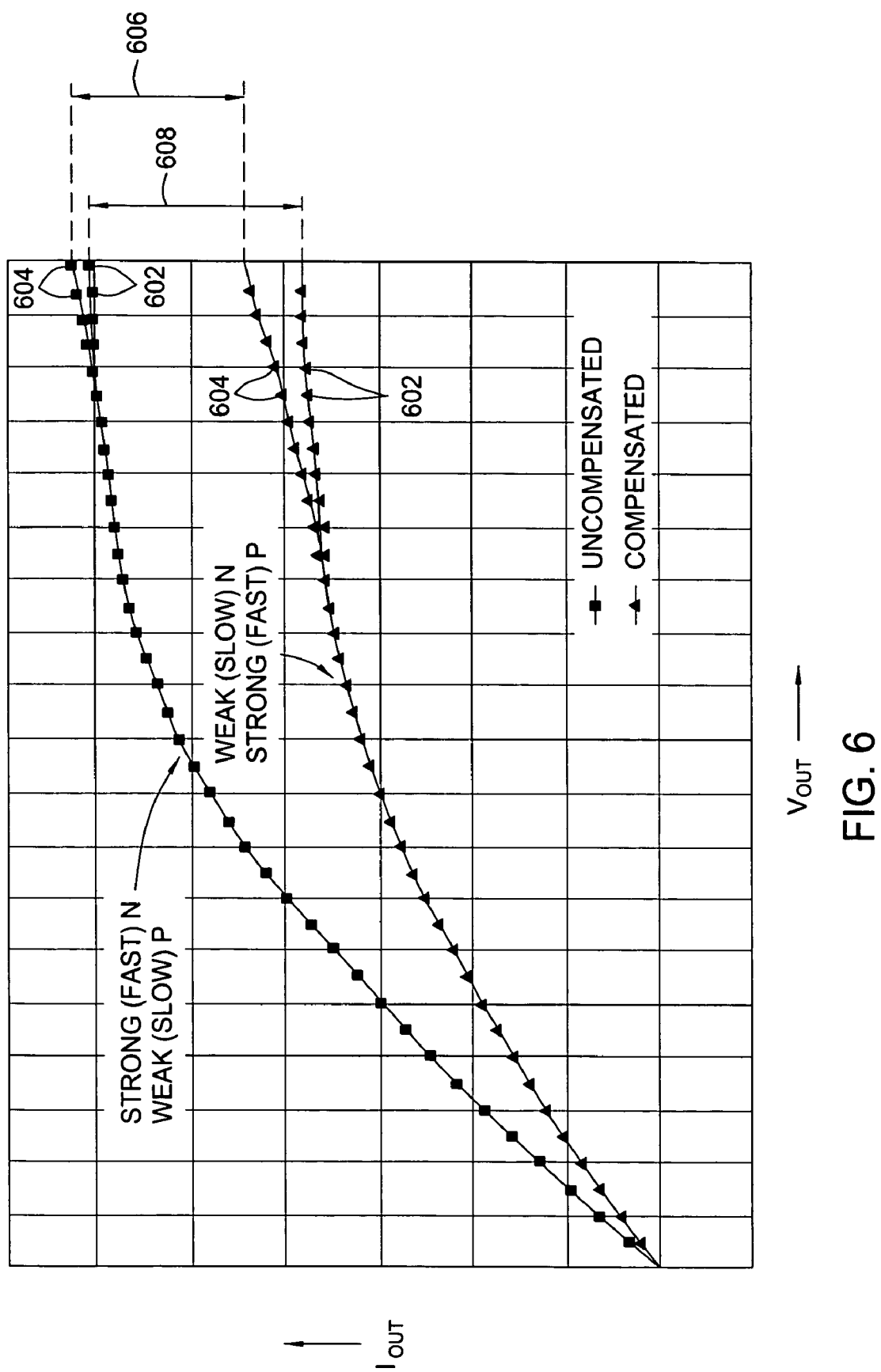

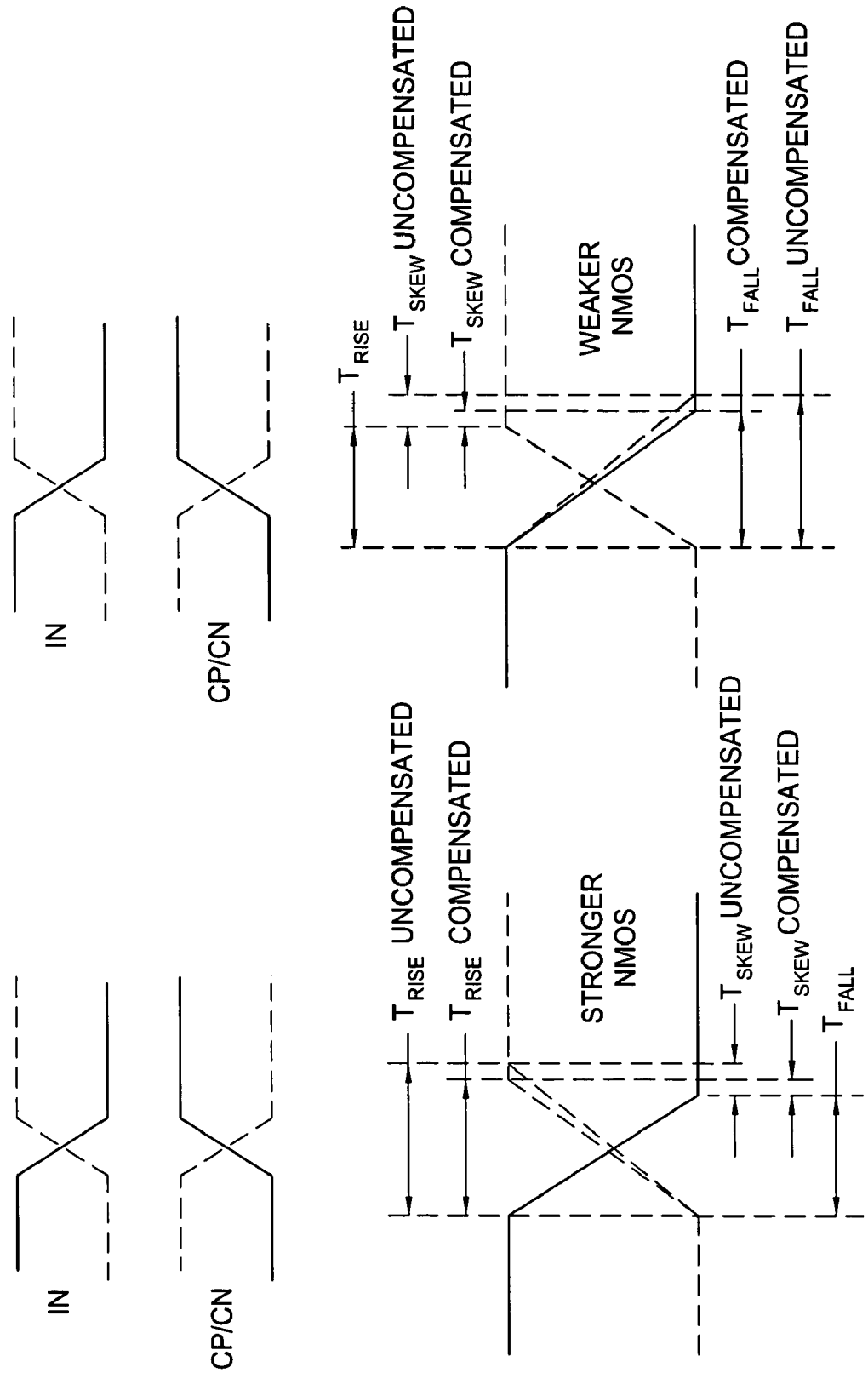

METHOD TO IMPROVE CURRENT AND SLEW RATE RATIO OF OFF-CHIP DRIVERS

BACKGROUND OF THE INVENTION

1. Field of the Invention

The present invention generally relates to integrated circuit devices and, more particularly to off-chip driver circuits utilized in integrated circuit devices.

2. Description of the Related Art

Off-chip driver circuits (OCDs) are used to drive a variety of different type signals, such as data and clock signals, out of integrated circuit device (IC), typically onto a bus. To ensure system signal integrity, an OCD has to be designed to meet both DC and AC specifications. While the DC specification defines static characteristics such as drive strength, AC specifications define dynamic characteristics, such as slewrate and propagation delay of the OCD. To ensure that low-to-high (L-H) and high-to-low (H-L) transitions of the OCD (propagation delay, rise and fall times) do not differ too much to each other, acceptable pull-up/pull-down current ratio, as well as pull-up/pull-down slewrate ratio, ranges are specified.

As illustrated in FIG. 1, a conventional OCD circuit 100 typically utilizes two stages: a control (pre-driver) stage 110 and a simple inverter (end driver) stage 120. The control stage 110 typically receives an input signal (IN) and an output enable (OE) signal, which are applied to a NAND gate 112, NOR gate 114, and inverter 116, in order generate a pair of voltage control signals CP and CN. When the OE signal is not asserted, outputs CP and CN of the control stage 110 are in a high-impedance state. When OE is asserted, outputs CP and CN, that are typically an inversion of the input signal IN, are applied to inputs of the end driver stage 120.

The end driver stage 120 receives the signals CP and CN and, in response generates a corresponding output signal $V_{OUT}$, that is typically a logical inversion thereof (i.e., a non-inverted version of the input signal IN). As illustrated, the end driver stage 120 includes a P-type transistor MP1 122 and an N-type transistor MN1 124, with resistors 126 and 128 to set a desired output impedance when the outputs are disabled (OE de-asserted). With the outputs enabled (OE asserted), as CP and CN transition high, MN1 is turned on and MP1 is turned off. Therefore, the output node is pulled low as current IN1 flows through MN1, thus resulting in a logic low for the output signal OUT. As CP and CN transition low, MN1 is turned off and MP1 is turned on. Therefore, the output node is pulled high as current IP1 flows through MP1, thus resulting in a logic low for the output signal OUT.

Thus, the main purpose of the end driver stage 120 is to drive the input signal IN to the bus (e.g., on a bus line with a representative capacitive load $C_{LOAD}$), preferably with little difference (or "skew") between rising and falling edges. One approach to reduce this skew is to tune the size of the transistors used in the end driver stage 120 to match the rate at which the output node is discharged or charged (as current IN1 and IP1 flows, respectively). However, current flow through NMOS and PMOS transistors is highly sensitive to process variations (e.g., variations in supply voltages or operating temperature).

As illustrated in FIG. 2A, process variations resulting in stronger NMOS current drive (relative to PMOS current drive) may result in the output node being pulled down through MN1 faster than it is pulled up through MP1 (resulting, e.g., in a faster discharge rate). Similarly, as illustrated in FIG. 2B, process variations resulting in weaker NMOS current drive may result in output node being pulled down through MN1 slower than it is pulled up through MP1 (resulting, e.g., in a faster charge rate). Either case results in a skew ($t_{SKEW}$) between rise time ($t_{RISE}$) and fall time ($t_{FALL}$) which must be accounted for in the corresponding specified setup/hold time of the output signal OUT. As device frequencies increase, it is essential to minimize such skew.

One method to minimize such skew is to utilize a circuit compensation scheme, for example, in an effort to speed up slower devices while slowing faster devices to match one another in speed and drive strength. A common compensation scheme is illustrated in FIG. 3. A compensating device (MPC 302) is connected to a known resistor RA 304. The voltage drop ($V_A$) at $R_A$ is fed to an operational amplifier 306. The amplifier 306 compares this voltage ($V_A$) to that of a reference voltage ($V_{REF}$). Thus, depending on the process, the output voltage of the amplifier ($V_{BIAS}$) is generated such that $V_A$ matches $V_{REF}$. $V_{BIAS}$ can then be used to bias various P-type transistors in OCDs across a common chip. As illustrated in FIG. 3B, a similar compensating circuit 320 can also be used to compensate N-type transistors, utilizing an N-type compensating device MNC 322 and a known resistor RB 324 connected to an operational amplifier 326.

Unfortunately, before the compensating voltage $V_{BIAS}$ can be used, it has to be distributed on the chip to each OCD or other circuits which need to be compensated. To reduce noise resulting from coupling to other digital lines, lines carrying $V_{BIAS}$ should be closely shielded. As a result, the distribution of $V_{BIAS}$ may consume a significant amount of available routing space. The increased current may result in substantial increases in power consumption and determining the proper values of $V_{REF}$ and the resistors ($R_A$ and $R_B$) may require substantial testing. Further, process variations may make it difficult to accurately control the values of $R_A$ and $R_B$, consequently making it difficult to accurately control the bias voltage.

Accordingly, there is a need for an improved off-chip driver circuit (OCD) that is less sensitive to process variations than conventional OCDs.

SUMMARY OF THE INVENTION

Embodiments of the invention generally provide techniques and apparatus that may be utilized to reduce the sensitivity of off-chip driver circuits (OCDs) to process variations.

One embodiment provides a method for reducing skew between rising and falling data at an output node of an off-chip driver circuit. The method generally includes generating one or more intermediate voltage signals from an input voltage signal applied to an input node of the driver circuit, generating an output voltage signal at the output node based on the one or more intermediate voltage signals, and providing one or more compensating current paths to or from the output node to compensate for differences between a rate at which the output node is charged and a rate at which the output node is discharged, wherein each compensating current path comprises serially coupled transistors of complementary process types.

Another embodiment generally provides an off-chip driver circuit. The off-chip driver circuit generally includes a first stage for generating one or more intermediate voltage signals from an input voltage signal applied to an input node of the first stage, and a second stage to receive the one or more intermediate voltage signals and, in response, generate, on an output node of the second stage, an output voltage based on the intermediate voltage signal by selectively switching pull-up and pull-down transistors. The off-chip driver circuit also includes at least one compensating current path between the output node and a supply or ground line to compensate for changes in at least one of a rate at which the output node is charged and a rate at which the output node is discharged, the at least one compensating current path comprising serially coupled transistors of complementary process types.

Another embodiment generally provides another off-chip driver circuit. The off-chip driver circuit generally includes a first stage configured to generate first and second intermediate voltage signals from an input voltage signal applied to an input node of the first stage and a second stage configured to generate an output voltage signal at an output node by switching pull-up and pull-down transistors based on the first and second intermediate voltage signals. The off-chip driver circuit also includes a compensating pull-up current path in parallel with the pull-up transistor, comprising a first PMOS transistor and a first NMOS transistor serially connected between a supply voltage line and the output node, and a compensating pull-down current path in parallel with the pull-down transistor, comprising a second PMOS transistor and a second NMOS transistor serially connected between the output node and a ground potential line.

Another embodiment generally provides an integrated circuit (IC) device. The IC device generally includes at least one output node for driving a signal onto an external signal line and at least one off-chip driver circuit. The at least one off-chip driver circuit generally includes a first stage for generating one or more intermediate voltage signals from an input voltage signal applied to an input node of the first stage, and a second stage to receive the one or more intermediate voltage signals and, in response, generate, on an output node of the second stage, an output voltage based on the intermediate voltage signal by selectively switching pull-up and pull-down transistors. The IC device also includes at least one compensating current path between the output node and a supply or ground line to compensate for changes in at least one of a rate at which the output node is charged and a rate at which the output node is discharged, the at least one compensating current path comprising serially coupled transistors of complementary process types.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6 is an exemplary pull-down current-voltage curve illustrating the effects of the compensating circuit of FIG. 5.

FIGS. 7A and 7B are timing diagrams illustrating the effects of the compensating circuit of FIG. 5.

DETAILED DESCRIPTION OF THE PREFERRED EMBODIMENT

The present invention generally provides an improved off-chip driver circuit (OCD) that reduces skew between rising and falling edges of output signals as process conditions vary. As previously described, variations in process conditions may result in stronger or weaker relative current drive between NMOS and PMOS transistors. For some embodiments, one or more process-dependent compensating current paths may be added to conventional pull-up and/or pull-down current paths to compensate for process variations by supplementing the current drive of transistors used to charge (PMOS) or discharge (NMOS) an output node of and end driver (e.g., inverter) stage of an OCD. As a result, rise and fall times of data driven at the output node of the OCD may be more closely matched, thus minimizing skew.

For example, as NMOS transistor current drive gets stronger, current in a compensating pull-up path may supplement (relatively weaker) PMOS transistor current drive. As NMOS current drive gets weaker, current flow through the compensating pull-up path may decrease accordingly. As used herein, the terms stronger and weaker current drives are relative terms, referring to NMOS current drive relative to PMOS current drive or vice-versa. Further, the term current path generally refers to a path for current from either a device that sources current to a node or sinks current from the node.

One skilled in the art will recognize that OCDs and compensating circuits described herein may be utilized to advantage in a variety of different integrated circuit devices, including, but not limited to processors and memory, such as dynamic random access memory (DRAM). By minimizing the skew between rising and falling data, setup and hold times may be reduced, allowing devices to operate at increased frequencies.

An Exemplary Off-Chip Driver

Figure 4:
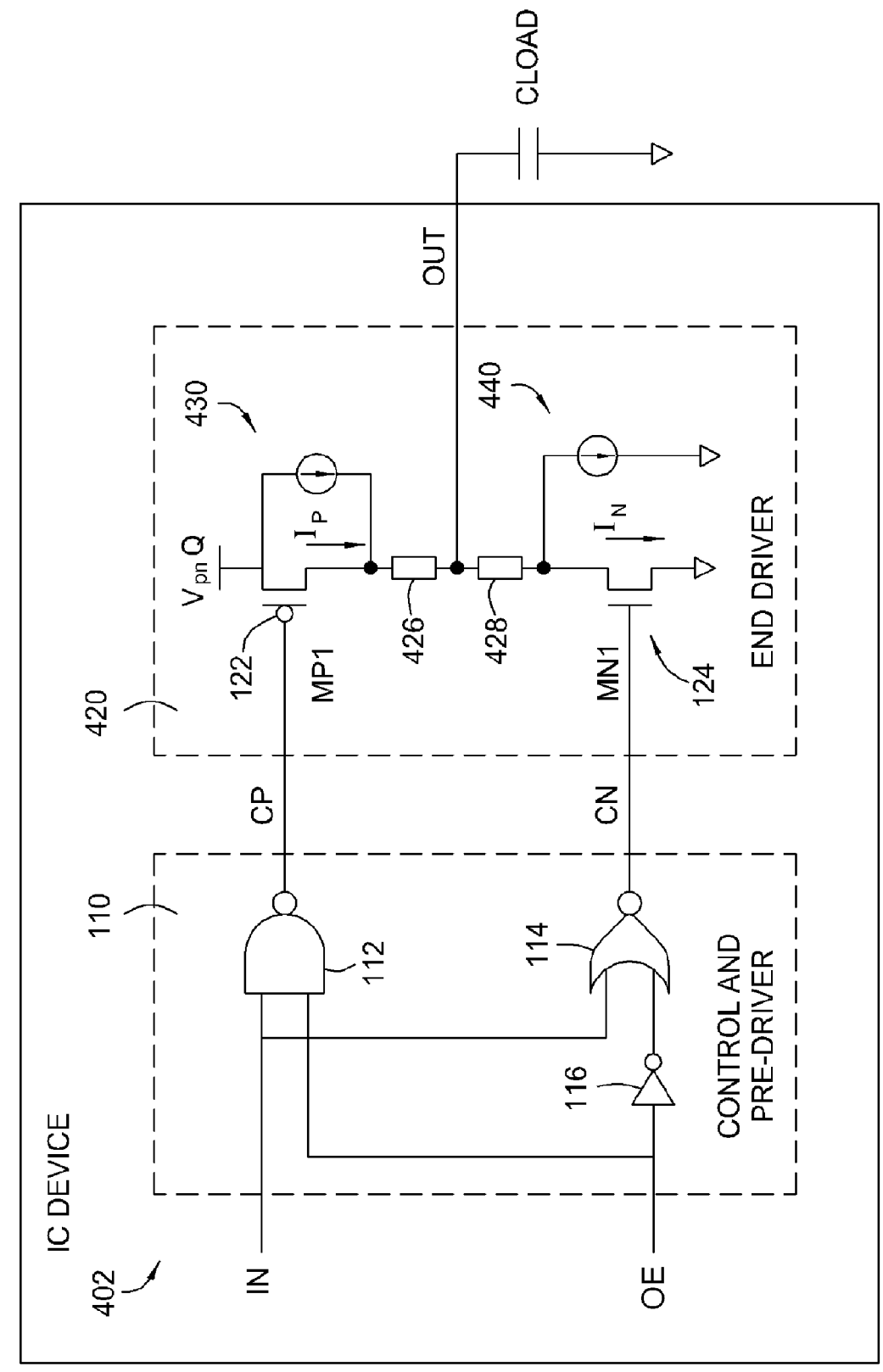
FIG. 4 is a schematic diagram of an exemplary OCD utilizing a compensation circuit in accordance with one embodiment of the present invention.

FIG. 4 illustrates an exemplary integrated circuit device 400 having an OCD circuit 400 utilizing a compensation scheme in accordance with one embodiment of the present invention. The OCD circuit 400 may be utilized to generate and drive an output signal (OUT) off chip, based on an input signal (IN). The IC device may be any of a wide variety of type IC devices, including, but not limited to processors, memory controllers, and memory devices. For some embodiments, the IC device may include a plurality of OCD circuits 400, for example, to drive a plurality of data signals onto a bus. These signals may include data signals (DQ), data strobe signals (DQS), clock signals (CLK), and the like.

Figure 1:
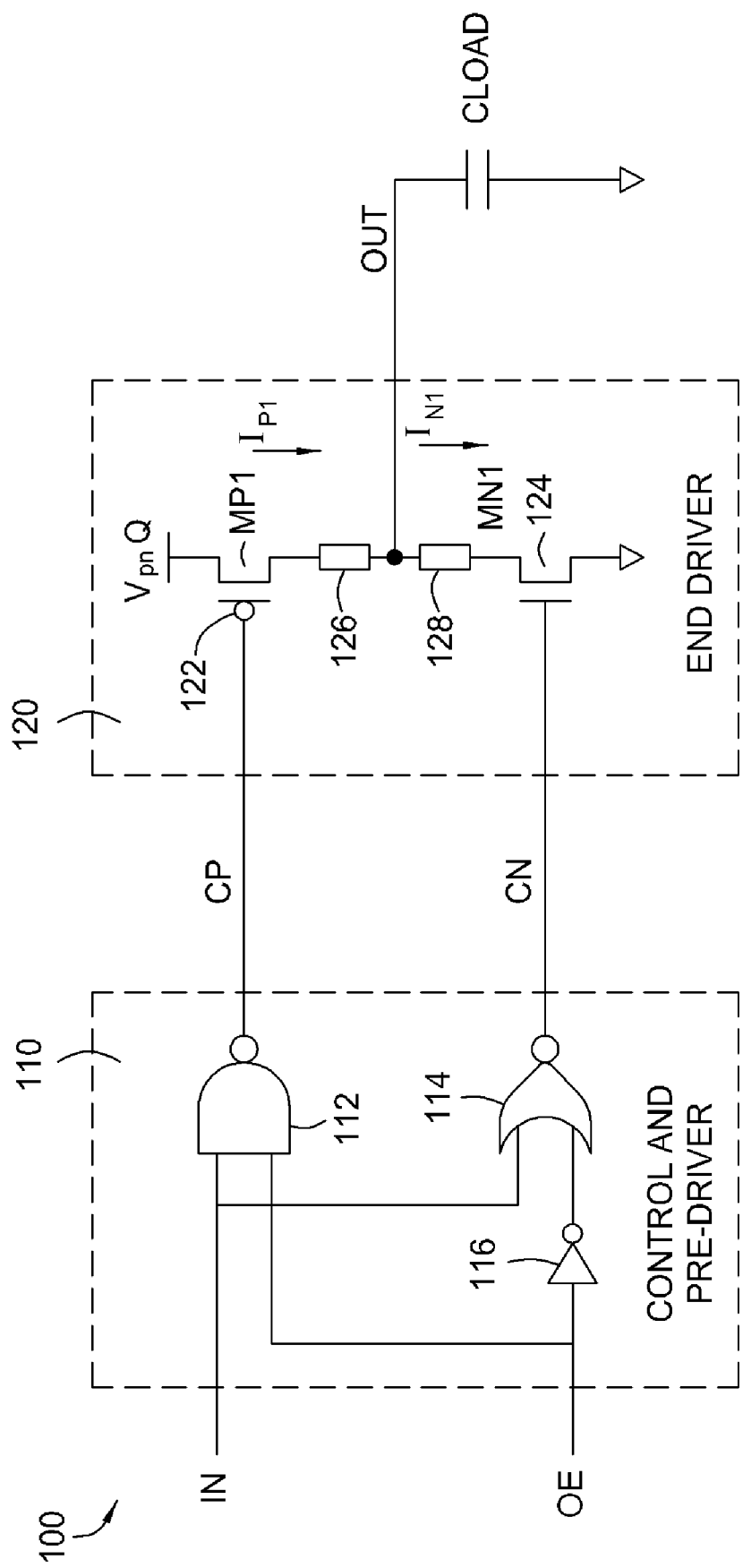
FIG. 1 is a schematic diagram of a conventional off-chip driver circuit (OCD).
Figures 2A, 2B:
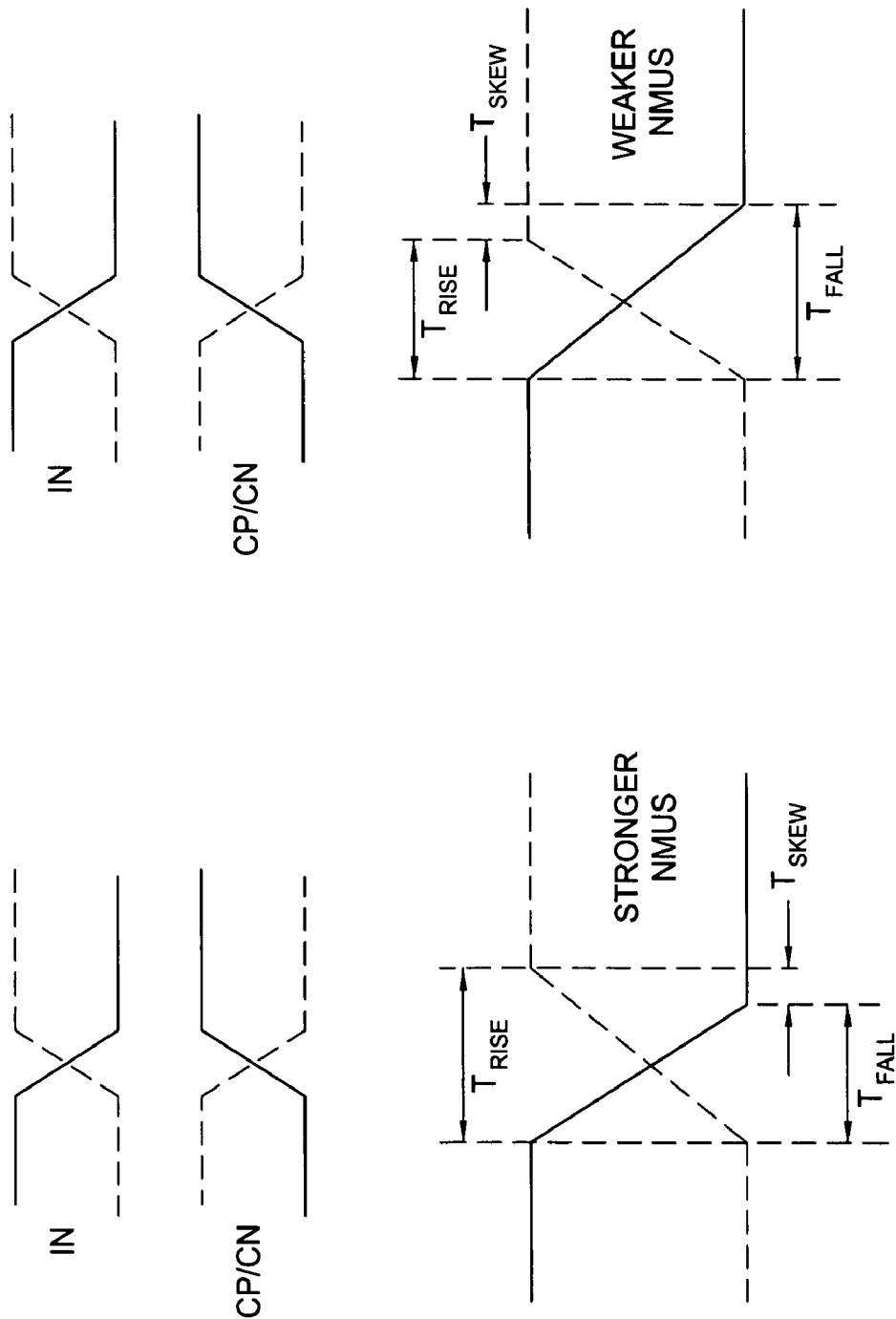
FIGS. 2A and 2B are exemplary timing diagrams corresponding to the OCD of FIG. 1.
Figure 3B:
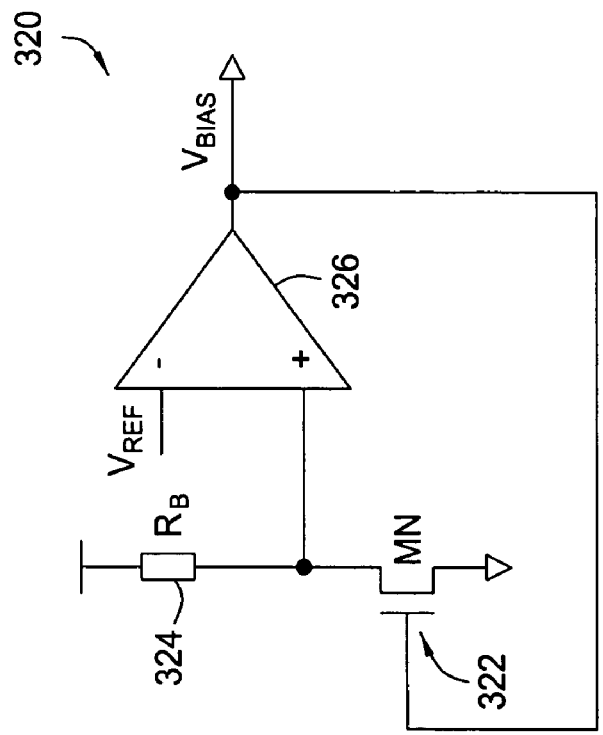
FIGS. 3A and 3B are schematic diagrams of conventional circuits for compensating P-type and N-type devices, respectively.
Figure 3A:
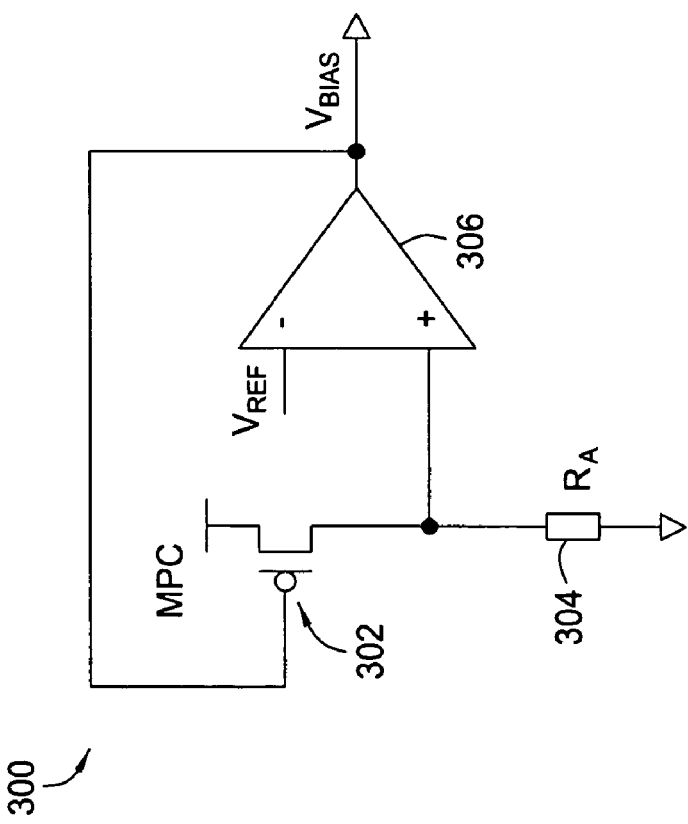

The OCD circuit 400 may include a control/pre-driver stage 110, and an end driver (e.g., inverter) stage 420. For some embodiments, the control/pre-driver stage 110 may operate in a similar manner to the control/pre-driver stage described above, with reference to FIG. 1, generating control signals CP and CN that are inverted relative to an input voltage signal (IN). For other embodiments, the control/pre-driver stage 110 may generate non-inverted control signals, separate complementary control signals, or, in some cases, a single control signal applied to both inputs of the end driver stage 420 (with possible changes in each case made to the end driver stage 420). As illustrated, an output enable control signal (OE) may be used to place the outputs CP and CN in a high impedance state. The end driver 420 may include resistors 426 and 428 to set the output impedance of the driver circuit 400 in the event the outputs are disabled (by de-asserting OE).

As previously described, the size of the transistors MN1 and MP1 used in the end driver stage 420 may be tuned in an effort to match the rate at which the output node is discharged or charged (as current IN1 and IP1 flows, respectively). However, the current drive of NMOS and PMOS transistors may be highly sensitive to process variations (e.g., static changes in fabrication or dynamic changes in supply voltage or operating temperature). As a result, transistors matched during certain (e.g., expected or nominal) operating parameters may not be matched as those parameters change. In an effort to compensate for these variations, one or more compensating current paths may be provided to and/or from an output node to compensate for process variations affecting pull-up and/or pull-down times. Each current path includes what may be considered a process-dependent current source.

For example, a first compensating current path may effectively include a current source 430 designed to compensate for process variations by providing an additional current $I_{CPU}$ to the pull-up path that is largely dependent on the strength of NMOS devices relative to PMOS devices. In other words, as relative NMOS strength increases, the compensating current $I_{CPU}$ may also increase (effectively speeding charge accumulation at the output node), resulting in faster rise times that more closely match what would otherwise be faster fall times due to a stronger NMOS device MN1 in the pull-down path.

Alternatively, or in addition to the first compensating current path, a second compensating current path may effectively include a current source 440 designed to compensate, in a similar manner, for process variations by providing an additional current $I_{CPD}$ to the pull-down path. In other words, as relative PMOS strength increases, the compensating current $I_{CPD}$ may also increase (effectively speeding discharge of the output node to ground), resulting in faster fall times that more closely match what would otherwise be faster rise times due to stronger PMOS device MP1 in the pull-up path.

Figure 5:
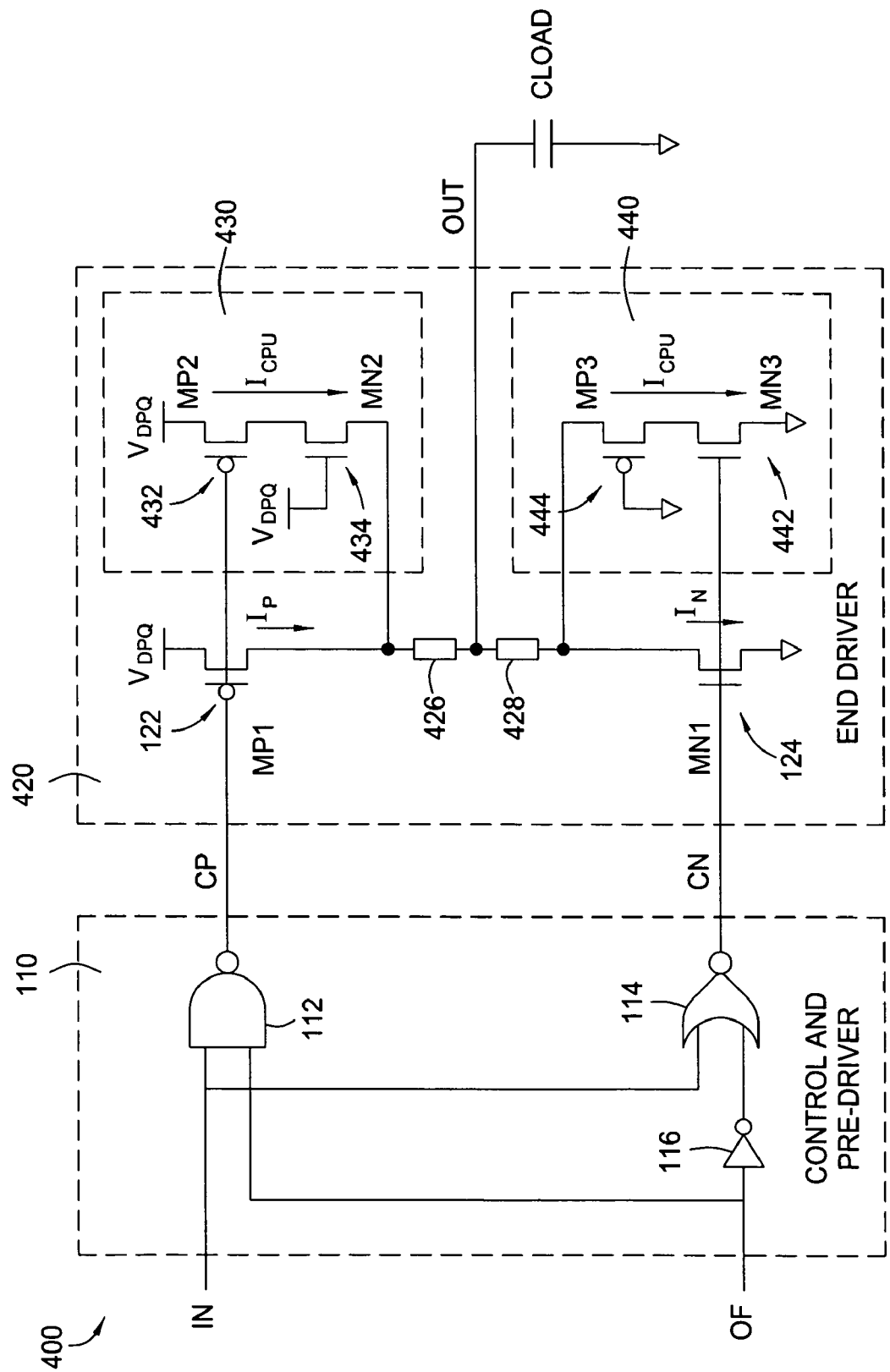
FIG. 5 is schematic diagram of a compensating circuit in accordance with one embodiment of the present invention.

As illustrated in FIG. 5, for some embodiments, the process dependent current sources 430 and 440 in each compensating current path may each be formed as a series connection of PMOS and NMOS devices. For example, the compensating current source 430 in the pull-up compensating current path may include a PMOS transistor MP2 432 in series with an NMOS transistor MN2 434. As illustrated, switching of MP2 may be controlled by the input signal CP, while MN2 may be permanently switched on by coupling its gate to a supply voltage (e.g., $V_{DDQ}$). In this configuration, when the input signal IN is low and CP is high, MP1 and MP2 will be turned off, the compensating path will have little effect.

On the other hand, when the input signal IN is high and CP is low, MP1 and MP2 will be switched on. In this configuration, the slower device in the compensating path will determine the compensating current flow. For example, first assuming a relatively stronger PMOS process, the compensating current $I_{CPU}$ will be limited by the NMOS device MN2 and will, thus, be relatively small compared to the current IP1 flowing in the original path. On the other hand, assuming a relatively stronger NMOS process, the compensating current $I_{CPU}$ will be more significant, speeding charge accumulation and resulting in faster rise times. In other words, due to their near proximity, components in the compensating and original paths are likely to be subject to the same process variations.

To accomplish a similar result, the compensating current source 440 in the pull-down compensating current path may include an NMOS transistor MN3 442 in series with a PMOS transistor MP3 444. As illustrated, switching of MN3 may be controlled by the input signal CN, while MP3 may be permanently switched on by coupling its gate to a ground potential. In this configuration, when the input signal IN is high and CN is low, MN1 and MN3 will be cutoff, the compensating path will have little effect.

On the other hand, when the input signal IN is low and CN is high, MN1 and MN3 will be switched on. First assuming a relatively stronger NMOS process, the compensating pull-down current $I_{CPD}$ will be limited by the PMOS device MP3 and will, thus, be relatively small compared to the current IN flowing in the original pull-down path. On the other hand, assuming a relatively stronger PMOS process, the compensating pull-down current $I_{CPD}$ will be more significant, speeding discharge to ground and resulting in faster fall times.

FIG. 6 illustrates an exemplary pull-down current-voltage curve illustrating the effects of this compensation in the pull-down path for the circuit shown in FIG. 5. The sampled points include both points 602 taken for a conventional end driver with no compensation (shown as triangles) and points 604 taken for an end driver utilizing the type of compensation described herein (circle). As illustrated, for the stronger NMOS (weaker PMOS) case, there is little additional current due to compensation, as the PMOS device MP3 in the compensating path renders the current contribution small relative to that of the original path.

On the other hand, for the weaker NMOS (stronger PMOS) case, the additional current due to compensation is much larger, resulting in a significant reduction in the current spread 606 across strong NMOS and weak NMOS process variations, when compared to the current spread 608 for uncompensated drivers. As described above, similar decreases in current spread may be seen for pull-up compensation, with a reduction in pull-up current spread (and faster pull-up times) as significant compensation current is added to the pull-up path in cases of weaker PMOS process variations.

As illustrated in FIGS. 7A and 7B, the effects of this compensation may be fall and rise times that more closely match each other, across the entire range of process variations. As illustrated in FIG. 7A, without compensation, process variations resulting in stronger NMOS current drive (relative to PMOS current drive) may result in the output node being pulled down through MN1 faster than it is pulled up through MP1, resulting in a faster fall time ($t_{FALL}$) than rise time (uncompensated $t_{RISE}$) and a relatively large skew (uncompensated $t_{SKEW}$) between the rise and fall times. However, with compensation, the additional pull-up current may result in faster rise times (compensated $t_{RISE}$) and a corresponding reduction in skew (compensated $t_{SKEW}$).

Similarly, as illustrated in FIG. 7B, without compensation, process variations resulting in weaker NMOS current drive may result in the output node being pulled down through MN1 slower than it is pulled up through MP1 resulting in a faster rise time ($t_{RISE}$) than fall time (uncompensated $t_{FALL}$), again resulting in a relatively large skew (uncompensated $t_{SKEW}$). However, with compensation, the additional pull-down current may result in faster fall times (compensated $t_{FALL}$) and a corresponding reduction in skew (compensated $t_{SKEW}$).

CONCLUSION

By providing one or more compensating current paths at the output node of an end driver stage of an off-chip driver, charge and discharge rates (rise and fall times) of the output node may be more evenly matched even in the event of process variations. By thus matching the charge and discharge rates of the output node, skew between rising and falling data provided at the output node may be relatively reduced. As a result, setup and hold times may be reduced accordingly, enabling higher frequency system designs.

While the foregoing is directed to embodiments of the present invention, other and further embodiments of the invention may be devised without departing from the basic scope thereof, and the scope thereof is determined by the claims that follow.

What is claimed is:

1. A method for reducing skew between rising and falling edges of a data signal at an output node of an off-chip driver circuit, comprising:
   generating one or more intermediate voltage signals from an input voltage signal applied to an input node of the driver circuit;
   generating an output voltage signal at the output node based on the one or more intermediate voltage signals; and
   providing one or more compensating current paths to or from the output node, said one or more compensating current paths adapted to compensate for differences between a rate at which the output node is charged and a rate at which the output node is discharged.

2. The method of claim 1, wherein one of the compensating current paths comprises:
   a first PMOS transistor having a gate coupled with an input to receive a first one of the intermediate voltage signals; and
   a first NMOS transistor coupled between the first PMOS transistor and the output node and having a gate coupled to a supply voltage line.

3. The method of claim 1, wherein one of the compensating current paths comprises:
   a first NMOS transistor having a gate coupled with an input to receive a first one of the intermediate voltage signals; and
   a first PMOS transistor coupled between the first NMOS transistor and the output node and having a gate coupled to a ground potential line.

4. The method of claim 1, wherein generating the one or more intermediate voltage signals comprises generating at least first and second intermediate voltage signals.

5. The method of claim 4, wherein:
   the first and second intermediate voltage signals are logically inverted relative to the input voltage signal; and
   the output voltage signal is logically non-inverted relative to input voltage signal.

6. The method of claim 4, wherein the first and second intermediate voltage signals are logical complements of each other.

7. An off-chip driver circuit, comprising:
   a first stage for generating one or more intermediate voltage signals from an input voltage signal applied to an input node of the first stage;
   a second stage to receive the one or more intermediate voltage signals and, in response, generate, on an output node of the second stage, an output voltage based on the intermediate voltage signal by selectively switching pull-up and pull-down transistors; and
   at least one compensating current path between the output node and a supply or ground line, said at least one compensating current path adapted to compensate for changes in at least one of a rate at which the output node is charged and a rate at which the output node is discharged, the at least one compensating current path comprising serially coupled transistors of complementary process types and wherein the at least one compensating current path is adapted to compensate for differences between a rate at which the output node is charged and a rate at which the output node is discharged.

8. The off-chip driver circuit of claim 7, wherein the at least one compensating current path comprises:
   a first PMOS transistor having a gate coupled with an input to receive a first one of the intermediate voltage signals; and
   a first NMOS transistor coupled between the first PMOS transistor and the output node and having a gate coupled to a supply voltage line.

9. The off-chip driver circuit of claim 7, wherein the at least one compensating current path comprises:
   a first NMOS transistor having a gate coupled with an input to receive a first one of the intermediate voltage signals; and
   a first PMOS transistor coupled between the first NMOS transistor and the output node and having a gate coupled to a ground potential line.

10. The off-chip driver circuit of claim 7, wherein the first stage is configured to generate at least first and second intermediate voltage signals.

11. The off-chip driver circuit of claim 10, wherein:
    the first and second intermediate voltage signals are logically inverted relative to the input voltage signal; and
    the output voltage signal is logically non-inverted relative to input voltage signal.

12. The off-chip driver circuit of claim 11, wherein the first and second intermediate voltage signals are logical complements of each other.

13. An off-chip driver circuit, comprising:
    a first stage configured to generate first and second intermediate voltage signals from an input voltage signal applied to an input node of the first stage;
    a second stage configured to generate an output voltage signal at an output node by switching pull-up and pull-down transistors based on the first and second intermediate voltage signals;
    a compensating pull-up current path in parallel with the pull-up transistor, comprising a first PMOS transistor and a first NMOS transistor serially connected between a supply voltage line and the output node; and
    a compensating pull-down current path in parallel with the pull-down transistor, comprising a second PMOS transistor and a second NMOS transistor serially connected between the output node and a ground potential line.

14. The off-chip driver circuit of claim 13, wherein, in the compensating pull-up current path, a gate of the PMOS transistor is coupled to a node receiving the first intermediate voltage signal and a gate of the NMOS transistor is coupled to the supply voltage line.

15. The off-chip driver circuit of claim 13, wherein, in the compensating pull-down current path, a gate of the NMOS transistor is coupled to a node receiving the second intermediate voltage signal and a gate of the PMOS transistor is coupled to the ground potential line.

16. An integrated circuit (IC) device, comprising:
 at least one output node for driving a signal onto an external signal line; and
 at least one off-chip driver circuit having,
 a first stage for generating one or more intermediate voltage signals from an input voltage signal applied to an input node of the first stage,
 a second stage to receive the one or more intermediate voltage signals and, in response, generate, on an output node of the second stage,
 an output voltage based on the intermediate voltage signal by selectively switching pull-up and pull-down transistors, and
 at least one compensating current path between the output node and a supply or ground line, said at least one compensating current path adapted to compensate for changes in at least one of a rate at which the output node is charged and a rate at which the output node is discharged, the at least one compensating current path comprising serially coupled transistors of complementary process types and wherein the at least one compensating current path is adapted to compensate for differences between a rate at which the output node is charged and a rate at which the output node is discharged.

17. The IC device of claim 16, wherein the at least one compensating current path comprises a pull-up current path comprising:
 a first PMOS transistor having a gate coupled with an input to receive a first one of the intermediate voltage signals; and
 a first NMOS transistor coupled between the first PMOS transistor and the output node and having a gate coupled to a supply voltage line.

18. The IC device of claim 16, wherein the at least one compensating current path comprises a pull-down current path comprising:
 a first NMOS transistor having a gate coupled with an input to receive a first one of the intermediate voltage signals; and
 a first PMOS transistor coupled between the first NMOS transistor and the output node and having a gate coupled to a ground potential line.

19. The IC device of claim 18, wherein the at least one compensating current path further comprises a pull-up current path comprising:
 a first PMOS transistor having a gate coupled with an input to receive a first one of the intermediate voltage signals; and
 a first NMOS transistor coupled between the first PMOS transistor and the output node and having a gate coupled to a supply voltage line.

20. The IC device of claim 16, wherein:
 the IC device is a memory device;
 the at least one output node comprises a plurality of output nodes for driving a plurality of data signals onto an external data bus; and
 the at least one off-chip driver circuit comprises a plurality of off-chip driver circuits, each to generate a different one of the data signals.

21. The IC device of claim 20, further comprising:
 at least one output node for driving a data strobe signal; and
 the at least one off-chip driver circuit further comprises at least one off-chip driver circuit to generate the data strobe signal.

22. A method for reducing skew between rising and falling data at an output node of an off-chip driver circuit wherein the output node is connected to a pull-up circuit and to a pull-down circuit, wherein the pull-up circuit and the pull-down circuit comprise transistors of complementary types, comprising:
 generating one or more intermediate voltage signals from an input voltage signal applied to an input node of the driver circuit;
 generating an output voltage signal at the output node based on the one or more intermediate voltage signals; and
 providing one or more compensating current paths to or from the output node wherein the one or more compensating current oaths are adapted to provide a compensation current that is dependent on the strength of the pull-up circuit relative to the strength of the pull-down circuit and thereby adapted to compensate for the differences between a rate at which the output node is charged and a rate at which the output node is discharged.

23. An off-chip circuit, comprising:
 a first stage for generating one or more intermediate voltage signals from an input voltage signal applied to an input node of the first stage;
 a second stage to receive the one or more intermediate voltage signals and, in response, generate, on an output node of the second state, an output voltage based on the intermediate voltage signal by selectively switching pull-up and pull-down transistors; and
 at least one compensating current path between the output node and a supply or ground line, wherein the compensation current path is adapted for generating a compensation current which is dependent of the strength of the pull-up transistor relative to the transistor of the pull-down transistor and thereby adapted to compensate for changes in at least one of a rate at which the output node is charged and a rate at which the output node is discharged.

* * * * *

UNITED STATES PATENT AND TRADEMARK OFFICE
CERTIFICATE OF CORRECTION

PATENT NO. : 7,265,585 B2  Page 1 of 1
APPLICATION NO. : 11/012777
DATED : September 4, 2007
INVENTOR(S) : Thoai Thai Le et al.

It is certified that error appears in the above-identified patent and that said Letters Patent is hereby corrected as shown below:

In Claim 22, at Column 10, Line 30, please delete "oaths" and insert --paths--.

Signed and Sealed this

Nineteenth Day of August, 2008

JON W. DUDAS
*Director of the United States Patent and Trademark Office*